United States Patent
Park et al.

(10) Patent No.: US 7,122,466 B2
(45) Date of Patent: Oct. 17, 2006

(54) TWO STEP SEMICONDUCTOR MANUFACTURING PROCESS FOR COPPER INTERCONNECTS

(75) Inventors: Young-Joon Park, Plano, TX (US); Srikanth Krishnan, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/628,198

(22) Filed: Jul. 28, 2003

(65) Prior Publication Data

US 2005/0023688 A1 Feb. 3, 2005

(51) Int. Cl.
*H01L 21/4763* (2006.01)
*C25D 15/00* (2006.01)

(52) U.S. Cl. ............. 438/637; 438/660; 438/687; 205/109; 205/149

(58) Field of Classification Search ............ 438/687
See application file for complete search history.

(56) References Cited

U.S. PATENT DOCUMENTS

| 6,451,682 | B1* | 9/2002 | Fujikawa et al. ........... 438/618 |
| 6,709,562 | B1* | 3/2004 | Andricacos et al. ........ 205/122 |
| 6,709,970 | B1* | 3/2004 | Park et al. ................. 438/620 |
| 6,753,251 | B1* | 6/2004 | Ritzdorf et al. ............ 438/638 |
| 6,861,354 | B1* | 3/2005 | Uzoh et al. ................ 438/643 |

* cited by examiner

*Primary Examiner*—Alonzo Chambliss
(74) *Attorney, Agent, or Firm*—Rose Alyssa Keagy; W. James Brady; Frederick J. Telecky, Jr.

(57) ABSTRACT

An embodiment of the invention is a method of manufacturing copper interconnects 30 on a semiconductor wafer 10 where an electroplating process is used to deposit a first layer of copper grains 30*d* having an initial grain size and a second layer of copper grains 30*e* having a different initial grain size.

8 Claims, 2 Drawing Sheets

TWO STEP SEMICONDUCTOR MANUFACTURING PROCESS FOR COPPER INTERCONNECTS

FIELD OF THE INVENTION

This invention relates to the fabrication of integrated circuit copper interconnects during the semiconductor manufacturing process.

DETAILED DESCRIPTION OF THE INVENTION

Stress induced voiding in copper interconnects is reduced through the use of a two step electroplating process. This invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention.

Figure 1:
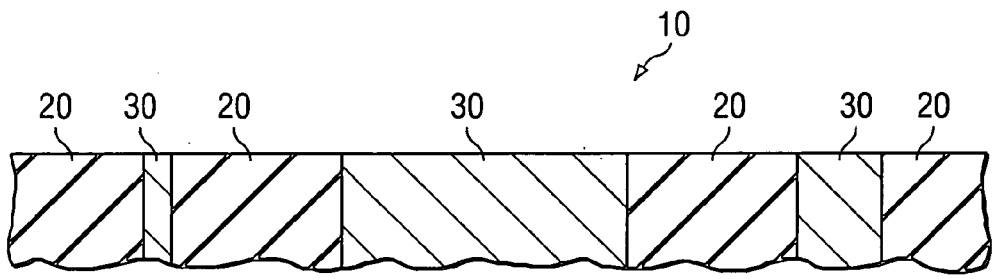
FIG. 1 is a cross-sectional view of a partially fabricated semiconductor wafer in accordance with the present invention.

Referring to the drawings, FIG. 1 is a cross-sectional view of a portion 10 of a partially fabricated semiconductor wafer in accordance with the present invention. More specifically, FIG. 1 shows a portion of a metal interconnect layer of an integrated circuit. The metal interconnect layer consists generally of dielectric material 20 and metal interconnects 30.

Metal interconnects 30 properly route electrical signals and power throughout the integrated circuit. In the example application, the metal interconnects 30 are comprised of copper. The dielectric material 20 electrically insulates the metal interconnects 30.

Figure 2:
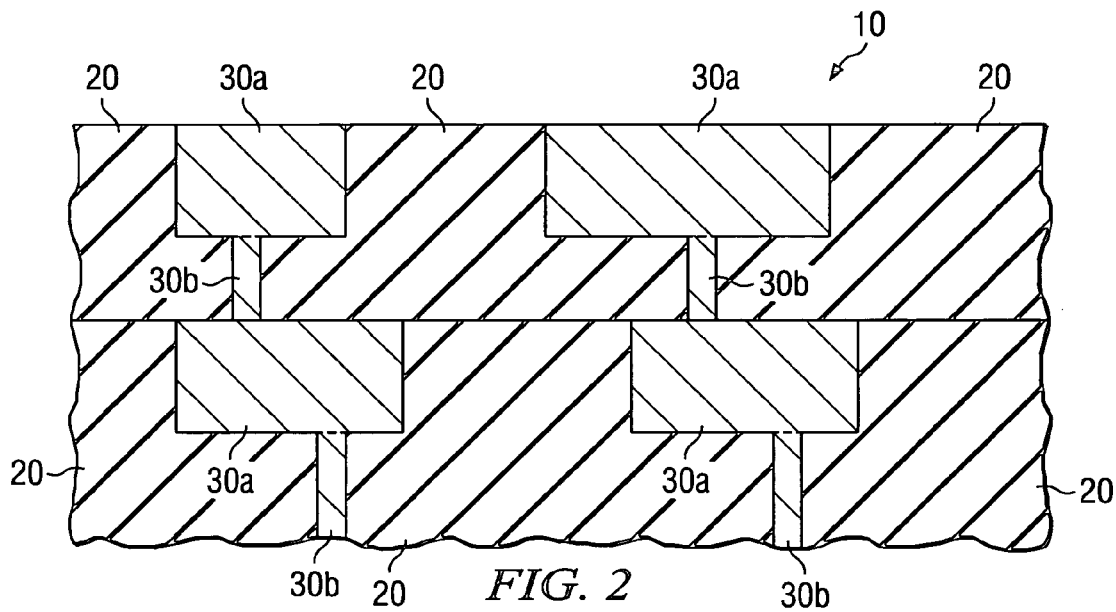
FIG. 2 is a cross-sectional view of a partially fabricated semiconductor wafer in accordance with another embodiment of the present invention.
Figure 3:
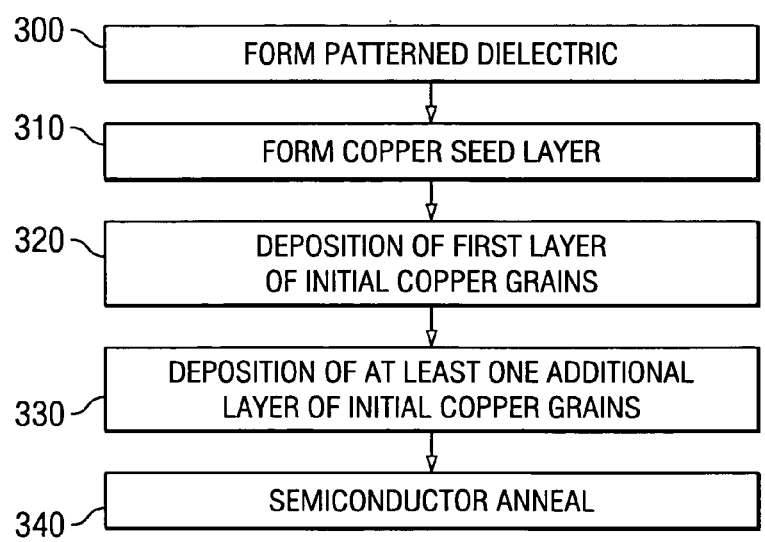
FIG. 3 is a flow diagram illustrating the process flow of the present invention.
Figure 4:
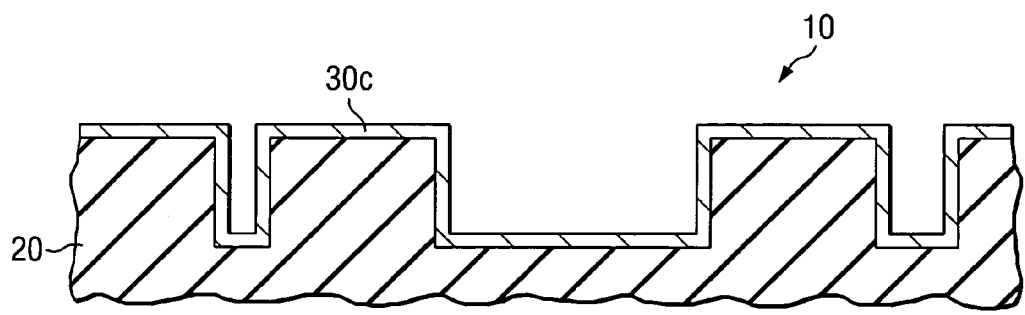
FIGS. 4–6 are cross-sectional views of a process for forming single damascene copper interconnects in accordance with the present invention.

The metal interconnect layer shown in FIG. 1 is a single damascene structure. However, the use of any structure for the metal interconnect layer is within the scope of the invention. For example, FIG. 2 is a cross-sectional view of a portion 10 of a partially fabricated semiconductor wafer in accordance with another embodiment of the present invention. More specifically, FIG. 2 shows a portion of a metal interconnect layer having a dual damascene structure. In addition to the dielectric material 20, the copper interconnects of the dual damascene structure are comprised of a trench portion 30a and a via portion 30b. The trenches 30a properly route electrical signals and power throughout the integrated circuit. As shown in FIG. 2, the vias 30b provide the desired electrical connections between trench portions 30a of adjoining metal interconnect layers.

Referring to FIGS. 3–6, the stress induced voiding of copper interconnects (30 or 30a) is reduced through the use of a two step electroplating process. In step 300, shown in FIG. 3, the fabrication of a metal interconnect layer generally begins with the formation of the patterned dielectric layer 20. As shown in the example single damascene application in FIG. 4, the spaces in the patterned dielectric 20 are the future locations of the copper interconnects 30. The initial dielectric layer may be formed using any standard manufacturing process, such as Chemical Vapor Deposition ("CVD"). In the example application, the dielectric material 20 is a low-k OSG material such as CORAL (manufactured by Novellus). However, any other low-k dielectric or combination of dielectrics may be used. Once the dielectric layer is formed, a standard photoresist process may be used to create the patterned dielectric 20.

Step 310 is the formation of a copper seed layer 30c over the patterned dielectric 20. However, it is within the scope of the invention to deposit a layer of barrier metal (such as Ta, TaN or TaN/Ta bi-layer) before forming the copper seed layer 30c in order to prevent copper diffusion into the dielectric layer and also to improve the adhesion between the copper interconnect and the dielectric layer.

Figure 5:
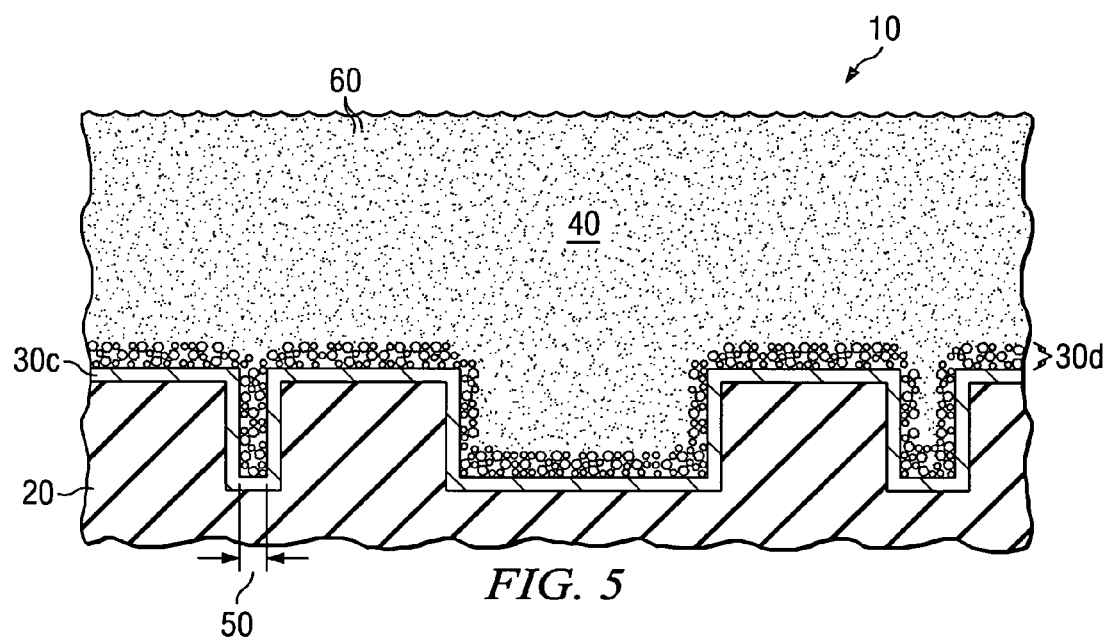

Referring now to FIG. 5, an electroplating process is used to super-fill the spaces in the dielectric 20 (to ultimately form the copper interconnects 30). Any suitable machine may be used for this electroplating process (such as the SABRE xT manufactured by Novellus). In step 320 the semiconductor wafer is immersed in an electroplating solution 40 that contains floating copper ions 60. With the copper seed 30c acting as the cathode an electrical current is applied to the electroplating solution. The resulting electrical charge causes some of the copper ions 60 (which are positively charged) to travel towards the copper seed 30c, thereby forming initial copper grains that cling to the copper seed 30c.

In the best mode application, the starting current level is an intensity that causes smaller initial copper grains to form on the copper seed. Specifically, the current level used is a level that attracts initial copper grains having a diameter smaller than the smallest interconnect feature width 50. During this first step of the super-fill electroplating process, a first layer 30d of smaller initial copper grains is formed over the copper seed 30c.

Figure 6:
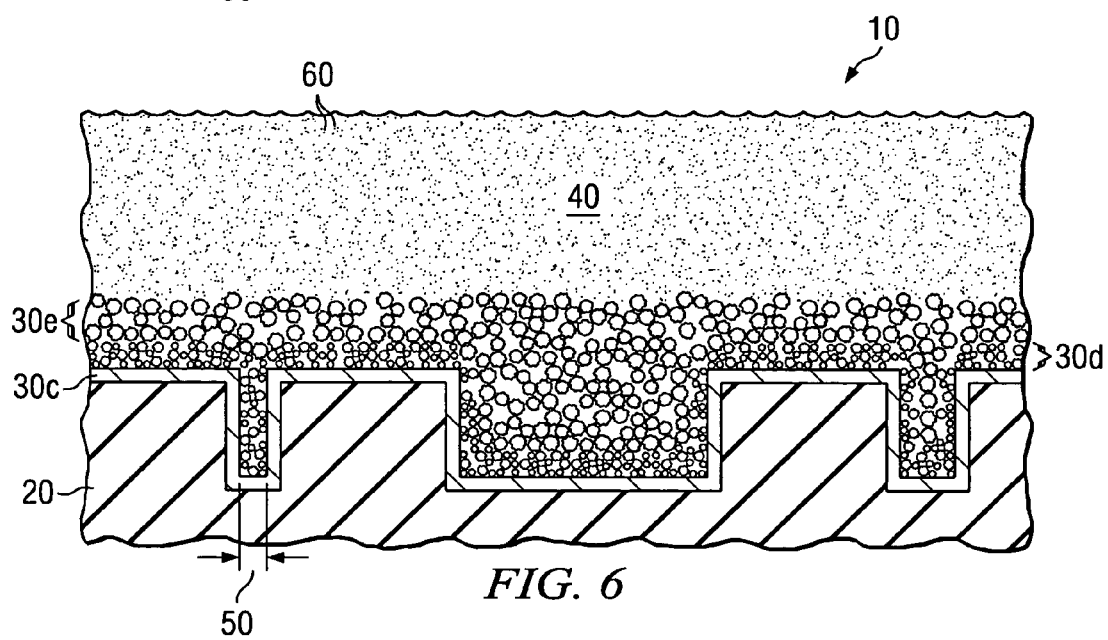

Once the small interconnect spaces are filled, the current used for the electroplating process is lowered so that a larger size of initial copper grains are attracted to the copper seed layer 30c. In the best mode application, a second current level is used to form a second layer 30e of larger initial copper grains over the first layer of initial copper grains 30d, as shown in FIG. 6. However, step 330 may comprise the deposition of numerous additional layers having varying initial grain sizes. For example, the level of electroplating current may be increased or decreased in a series of steps in order to create initial grain layers of distinctly different diameters. Alternatively, the level of electroplating current may be increased or decreased gradually; resulting in a gradual change in the diameter of the deposited initial grains.

In the best mode application the first step is to deposit a first layer having a grain size smaller than the smallest feature. This is followed by a second step where the current is lowered to a second level to attract larger initial grains and complete the super-filling of the larger features. However it is within the scope of the invention to vary the current level in any manner to attract initial grain sizes to the copper seed 30c in any sequence. For example, in the first electroplating step (320) a current that creates initial grain sizes larger than the smallest features may be used (thereby supper-filling the larger features), followed by a second electroplating step (330) where the current level is increased to create initial grain sizes that are smaller than the smallest features (thereby supper-filling the smallest features).

For the dual damascene metal interconnect structure shown in FIG. 2, the same fabrication process (shown in FIG. 3) is used. For example, in the first electroplating step (320) the vias 30b and any small trenches 30a may be super-filled. Then in the second electroplating step (330) the super-filling of the large trenches 30a is completed. The use of larger initial grains in the larger (trench) structures will reduce the tensile stresses within those larger structures as the semiconductor manufacturing process continues and also during the use of the final product containing the integrated circuit.

Referring again to FIG. 3, the semiconductor wafer is now annealed (preferably in-situ). The anneal process (step 340) causes the initial copper grains to grow into larger final grains, generates the tensile stress, improves the microstructure of the copper interconnects, and improves the electrical properties of the copper interconnects. In an example application, the anneal conditions are a temperature of 200° C. for 30 minutes. However, any suitable annealing process is within the scope of the invention. For example the anneal temperature may range from 100–300° C. and the time for the anneal may range from 10 min. to 1 hr.

The fabrication process now continues until the integrated circuit is complete. Generally the next fabrication step is a Chemical Mechanical Polishing (CMP) process that removes the excessive copper, planarizes the surface, and thereby creates the final copper interconnects structures 30 shown in FIGS. 1 and 2. Then a post-CMP clean is usually performed and the next metal interconnect level (if applicable) is fabricated in a similar fashion. It should be noted that other than process steps 320 and 330 the process steps for fabricating a metal interconnect layer should be those that are standard in the industry.

Various additional modifications to the invention as described above are within the scope of the claimed invention. For example, instead of performing an anneal at step 340, the anneal may be performed at any point (or numerous points) in the fabrication of the semiconductor wafer. Furthermore, the invention may be used to form the copper interconnects for metal interconnect levels having different structures than the single or dual damascene structures described above. Moreover, any initial grain sizes may be deposited on the copper seed using the above described invention. The larger grain sizes will reduce the resistivity of the final copper interconnect 30 and also reduce stress induced voiding.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of manufacturing copper interconnects on a semiconductor wafer comprising:

forming a layer of patterned dielectric material, said patterned dielectric material defining spaces for said copper interconnects;

depositing a copper seed layer over said layer of patterned dielectric material;

depositing a first layer of copper grains having a first initial grain size over said copper seed layer, said first layer of copper grains being deposited by an electroplating process; and depositing a second layer of copper grains having a second initial grain size over said first layer of copper grains having said first initial grain size, said second layer of copper grains being deposited by an electroplating process.

2. The method of claim 1 further comprising depositing at least one additional layer of copper grains of any initial grain size over said second layer of copper grains, said at least one additional layer of copper grains being deposited by an electroplating process.

3. The method of claim 2 wherein an initial grain size of said at least one additional layer of copper grains is larger than said first initial grain size.

4. The method of claim 1 wherein said first initial grain size is smaller than said second initial grain size.

5. The method of claim 1 further comprising annealing said semiconductor wafer after said step of depositing a second layer of copper grains.

6. The method of claim 5 wherein said annealing step is performed within a temperature range of 100° C. to 300° C. for a time between 10 minutes to 60 minutes.

7. A method of manufacturing copper interconnects on a semiconductor wafer comprising:

forming a layer of patterned dielectric material, said patterned dielectric material defining spaces for said copper interconnects;

depositing a copper seed layer over said layer of patterned dielectric material;

depositing a first layer of copper grains having a first initial grain size over said copper seed layer, said first layer of copper grain being deposited by an electroplating process; and depositing at least one additional layer of copper grains of differing initial grain sizes over said first layer of copper grains having first initial grain size, said at least one additional layer of copper grain being deposited by an electroplating process.

8. A method of manufacturing copper interconnects on a semiconductor wafer comprising:

forming a layer of patterned dielectric material, said patterned dielectric material defining spaces for said copper interconnects;

depositing a copper seed layer over said layer of patterned dielectric material;

depositing a first layer of copper grains having a first initial grain size over said copper seed layer, said first layer of copper grains being deposited by an electroplating process;

depositing a second layer of copper grains having a second initial grain size over said first layer of copper grains having said first initial grain size, said second layer of copper grains being deposited by an electroplating process and said second initial grain size being larger than said initial grain size; and annealing said semiconductor water.

* * * * *